United States Patent [19]

Monk et al.

[11] Patent Number: 5,302,534
[45] Date of Patent: Apr. 12, 1994

[54] FORMING A VERTICAL PNP TRANSISTOR

[75] Inventors: David J. Monk, Gilbert; Robert H. Reuss, Scottsdale; Jenny M. Ford, Mesa, all of Ariz.

[73] Assignee: Motorola, Inc., Schaumburg, Ill.

[21] Appl. No.: 844,311

[22] Filed: Mar. 2, 1992

[51] Int. Cl.⁵ .................... H01L 21/265; H01L 29/70
[52] U.S. Cl. ........................................ 437/31; 437/74; 257/37
[58] Field of Search .............. 437/31, 74; 252/370, 252/378

[56] References Cited

U.S. PATENT DOCUMENTS

| | | | |
|---|---|---|---|
| 4,543,707 | 10/1985 | Ito et al. | 437/63 |
| 4,939,099 | 7/1990 | Seacrist et al. | 437/31 |
| 4,996,581 | 2/1991 | Hamasaki | 437/31 |
| 5,010,026 | 4/1991 | Gomi | 437/31 |
| 5,087,579 | 2/1992 | Tomassetti | 437/74 |
| 5,091,322 | 2/1992 | Maeda | 437/31 |
| 5,183,768 | 2/1983 | Kameyama et al. | 437/31 |
| 5,200,347 | 4/1993 | Wang et al. | 437/31 |

FOREIGN PATENT DOCUMENTS 2245425 2/1992 United Kingdom ................ 437/74

OTHER PUBLICATIONS

D. de Lang et al., "Integration of Vertical PNP Transistors in ...", IEEE Bipolar Circuits and Tech. Meeting, pp. 190–193, (1989).

Pong-Fei Lu et al, "Stimulations of Collector Resistance of PNP ...", Solid State Electronics, vol. 32, No. 8, pp. 675–678, (1989).

K. Higashitani et al. "A Novel CBi-CMOS Tech. by DIIP ...", IE³ Symposium on VISI Tech., pp. 77–78, (1990).

*Primary Examiner*—Olik Chaudhuri
*Assistant Examiner*—Long Pham
*Attorney, Agent, or Firm*—Robert F. Hightower; Joe E. Barbee

[57] ABSTRACT

A transistor (10) is formed by utilizing an isolated well (18) within a thin epitaxial layer (14). A base mask (22) that has a base opening (23) is applied to expose a portion of the isolated well (18). A low resistance collector enhancement (24) is formed within the well (18) by doping a portion of the well (18) through the base opening (23). A base region (26) is formed overlying the collector enhancement (24) by doping the well (18) through the base opening (23). Forming the collector enhancement (24) through the base opening (23), facilitates providing the collector enhancement (24) with a small area thereby minimizing the transistor's (10) parasitic collector capacitance value, collector resistance, and transit time.

15 Claims, 1 Drawing Sheet

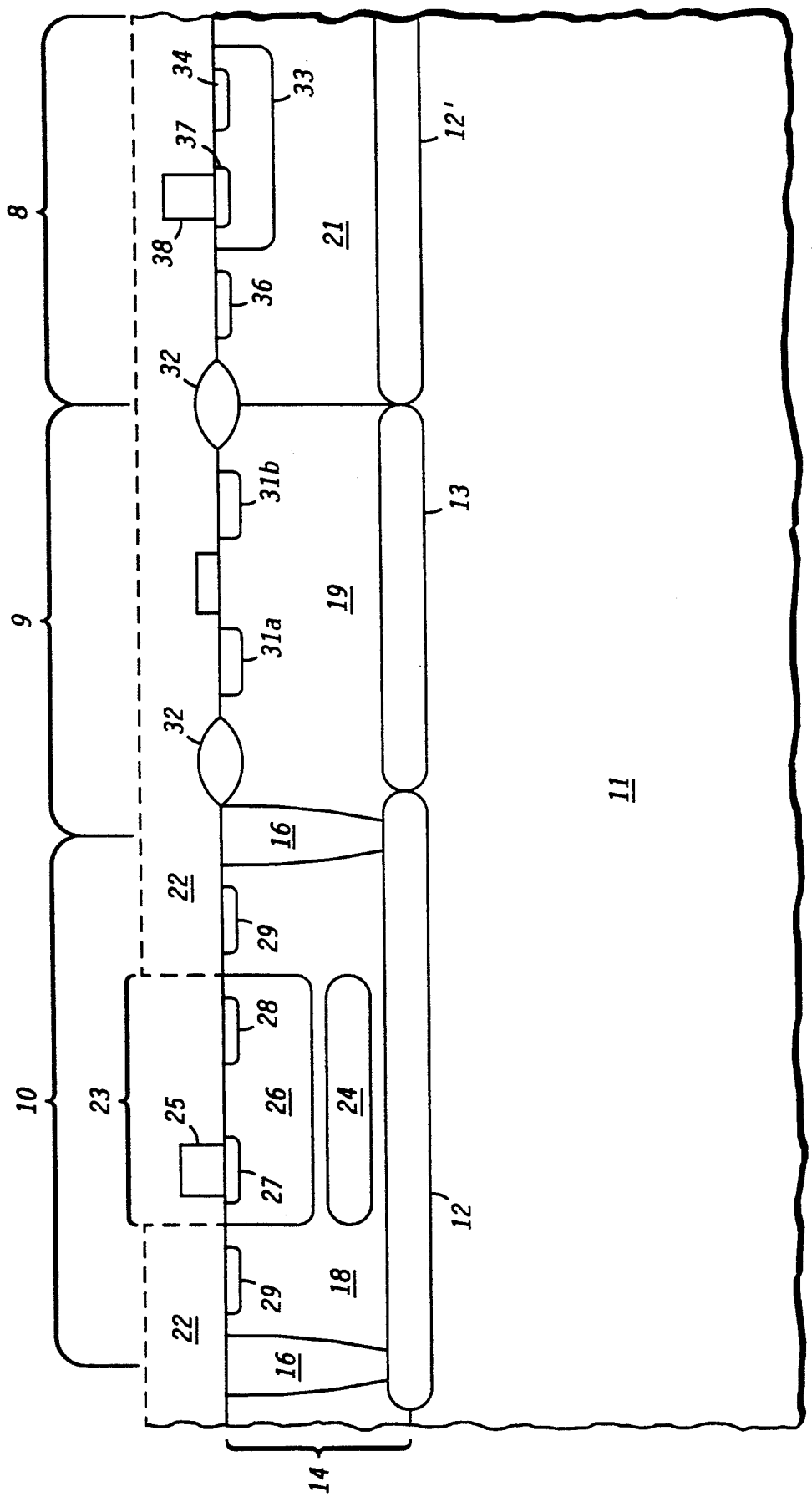

FORMING A VERTICAL PNP TRANSISTOR

BACKGROUND OF THE INVENTION

The present invention relates, in general, to semiconductor devices, and more particularly, to a novel bipolar transistor.

In the past, the semiconductor industry has produced complementary metal oxide semiconductor (CMOS) transistors along with bipolar PNP and NPN transistors on a single substrate. The combination of transistor types is often referred to as BICMOS. Vertical bipolar PNP transistors that are formed as part of a BICMOS device typically are formed in a P-type well that is isolated from other transistors on the BICMOS device by P-N junctions. A heavily doped region usually extends laterally across the entire P-type well in order to form a low resistance collector region for the transistor. This P-type well generally is formed in a thick epitaxial layer (typically thicker than 2.0 microns) in order to provide sufficient room within the epitaxial layer to form this low resistance collector region while allowing sufficient space to form a base above the collector. The thick epitaxial layer has the disadvantage of degrading the performance of NPN bipolar transistors by increasing the NPN transistor's vertical collector resistance and transit time. In addition, the PNP transistor's low resistance collector region occupies a large area that creates a large parasitic collector capacitance (usually greater than 950 femtofarads) thereby degrading the PNP transistor's performance.

Accordingly, it is desirable to have a PNP transistor that is formed on a thin epitaxial layer (less than 2.0 microns thick), that has a low collector resistance, that has a low collector capacitance (less than 950 femtofarads), and that does not limit the performance of NPN transistors.

SUMMARY OF THE INVENTION

Briefly stated, the present invention includes forming a transistor utilizing an isolated well within a thin epitaxial layer. A base mask that has a base opening is applied to expose a portion of the isolated well. A low resistance collector enhancement is formed within the well by doping a portion of the well through the base opening. A base region is subsequently formed overlying the collector enhancement by doping the well through the base opening. Forming the collector enhancement through the base opening facilitates providing a small collector enhancement area thereby minimizing the transistor's parasitic collector capacitance, collector resistance, and transit time.

As used herein, references to capacitance values, specifically 950 femtofarads and 320 femtofarads, refer to such values for a transistor collector that is approximately 45 microns by 45 microns.

BRIEF DESCRIPTION OF THE DRAWINGS

The sole FIGURE illustrates an enlarged cross-sectional view of a transistor in accordance with the present invention.

DETAILED DESCRIPTION OF THE DRAWINGS

The sole FIGURE illustrates a portion of a BICMOS device that includes a vertical PNP transistor 10, an N-type MOS transistor 9, and an NPN transistor 8. Transistors 8, 9, and 10 are formed on a P-type substrate 11 by implanting dopants into the substrate to form a P-type buried layer 13 and a plurality of N-type buried layers 12 and 12'. Buried layers 12, 12', and 13 can be formed by a variety of methods and from a variety of dopants that are well known in the semiconductor art. In the preferred embodiment, layers 12 and 12' are formed by implanting an arsenic dopant into substrate 11 using an implant energy of approximately 40–60 Kev and a dosage of approximately $8 \times 10^{15}$ atoms/cm$^2$ which forms a resulting arsenic concentration that is between approximately $1 \times 10^{19}$ and $8 \times 10^{19}$ atoms/cm$^3$. Also in this preferred embodiment, buried layer 13 is formed by implanting a boron dopant into substrate 11 to form a boron concentration that is between approximately $5 \times 10^{16}$ and $1 \times 10^{18}$ atoms/cm$^3$. A thin P-type epitaxial layer 14 is then formed to cover substrate 11 and buried layers 12, 12', and 13. The thickness of layer 14 is generally at least 1.0 microns but less than 2.0 microns in order to minimize the collector resistance and enhance the performance of NPN transistor 8. In the preferred embodiment, layer 14 has a thickness which is between approximately 1.0 and 1.6 microns. A donut shaped N-type sinker 16 is formed to surround the periphery of a P-type well 18 and to extend from a surface of epitaxial layer 14 to buried layer 12, thus, isolating P-type well 18. In this cross-sectional view, only two portions of the donut shape are visible. In the preferred embodiment, sinker 16 is formed by implanting a phosphorus dopant at an energy of approximately 180 Kev and a dosage of approximately $2 \times 10^{12}$ atoms/cm$^2$. Since p-type well 18 is isolated from other transistors, well 18 functions as the collector of transistor 10.

A collector enhancement 24 is formed to create a low resistance conduction path which minimizes the collector resistance of transistor 10. Enhancement 24 is formed by placing a base mask 22, illustrated by dashed lines, on epitaxial layer 14. Mask 22 has a base opening 23 through which collector enhancement 24 is formed. Since epitaxial layer 14 is thin, it is important to accurately position collector enhancement 24 in order to prevent electrically shorting base region 26 to buried layer 12 while forming enhancement 24 as thick as possible to minimize collector resistance. In the preferred embodiment, this control is provided by implanting enhancement 24 with a boron dopant concentration of between approximately $1 \times 10^{17}$ and $1 \times 10^{18}$ atoms/cm$^3$ with a peak doping concentration positioned between approximately 0.5 and 0.75 microns into well 18. Utilizing base opening 23 to form enhancement 24 not only facilitates controlling the position of enhancement 24, thereby permitting the use of a thin epitaxial layer, but also provides enhancement 24 with a small area thereby minimizing the parasitic collector capacitance of transistor 10. Such capacitance is typically formed between enhancement 24 and the isolation region comprising sinker 16 and layer 12. It is difficult to measure such capacitances, but computer simulations show that the parasitic collector capacitance of a transistor such as transistor 10 is typically about 320 femtofarads which is approximately 80% less than the 950 femtofarads of prior PNP transistors. Consequently, using base opening 23 to form enhancement 24 facilitates improving the performance PNP transistor 10 without degrading the performance of NPN transistor 8.

Subsequent to forming enhancement 24, base region 26 is formed by implanting an N-type dopant through base opening 23. In the preferred embodiment, a phosphorus dopant is implanted to form a doping concentration of between approximately $5 \times 10^{17}$ and $5 \times 10^{18}$ atoms/cm$^3$. It should be noted that an arsenic dopant may be used instead of phosphorus. Then mask 22 is removed. Also in this preferred embodiment, enhancement 24 and base 26 form a collector-base junction at an approximate depth of 0.25-0.5 microns. Such a shallow depth reduces carrier transit time and enhances the performance of transistor 10. A heavily doped P-type region within base region 26 forms an emitter 27. In the preferred embodiment, emitter 27 is formed by diffusing a P-type dopant from a polysilicon emitter contact 25 into base region 26. Such diffusion techniques are well known in the semiconductor art. An N-type ohmic base contact 28 is formed within base region 26 to facilitate forming an ohmic contact to base 26. A plurality of heavily doped P-type collector contacts 29 are formed by P-type regions that are within well 18 and external to base region 26.

An N-type well 21 that functions as the collector region of NPN transistor 8 is formed by doping a portion of epitaxial layer 14 that is overlying buried layer 12' with an N-type dopant. Transistor 8 also includes a P-type base region 33, a heavily doped P-type base contact 34, and an N-type emitter 37. In the preferred embodiment, emitter 37 is formed by diffusing dopants from a polysilicon emitter contact 38 into base region 33. A heavily doped N-type collector contact 36 facilitates forming ohmic contact to the collector of transistor 8. NMOS transistor 9 is formed in a P-type well 19 which is a portion of P-type epitaxial layer 14 overlying buried layer 13. A source 31a and drain 31b of transistor 9 are heavily doped N-type regions that are formed by a single implant operation. A plurality of field oxide regions 32 function to isolate transistor 9.

By now it should be appreciated that there has been provided a novel way to form a vertical PNP transistor. The method of creating a low resistance collector enhancement through a base mask opening minimizes the collector enhancement's area thereby minimizing the transistor's parasitic collector capacitance. In addition, the method provides accurate control over the placement of the collector enhancement thereby facilitating the use of a thin epitaxial layer and a shallow collector-base junction. This shallow junction reduces carrier transit time thereby enhancing the transistor's performance. The thin epitaxial layer minimizes the collector resistance of NPN transistors that are formed on the same substrate with the PNP transistor and enhances the NPN transistor's performance.

We claim:

1. A method of forming a vertical PNP transistor comprising:

providing a P-type substrate;

forming an N-type region on a portion of the substrate;

covering the substrate and the N-type region with a thin P-type epitaxial layer thereby forming the N-type region into a buried layer;

implanting an N-type sinker that extends from a surface of the P-type epitaxial layer to the N-type region wherein the sinker has a donut shape for the purpose of defining a P-well that is a portion of the P-type epitaxial layer overlying the N-type region and surrounded by the N-type sinker;

applying a base mask to the surface, the base mask having a base opening that exposes a portion of the P-well;

forming a collector enhancement through the base opening by doping a portion of the p-well with a P-type dopant, the collector enhancement forming a low resistance conduction path that lowers a collector resistance of the vertical PNP transistor and having a first distance from the surface;

forming a base region through the base opening by doping a portion of the P-well with an N-type dopant wherein the N-type dopant extends from the surface to a second distance from the surface that is less than the first distance and wherein the base region overlays the collector enhancement;

forming an emitter within the base region;

forming a base contact that is within the base region and adjacent to the emitter; and forming a plurality of collector contacts within a portion of the P-well external to the base region.

2. The method of claim 1 wherein forming the collector enhancement through the base opening includes implanting the P-type dopant through the base opening.

3. The method of claim 2 wherein implanting the P-type dopant includes implanting a boron dopant to form a dopant concentration of between approximately $1 \times 10^{17}$ atoms/cm$^3$ and $1 \times 10^{18}$ atoms/cm$^3$.

4. The method of claim 1 wherein the forming the collector enhancement through the base opening step includes forming the collector enhancement having a distance of between approximately 0.5 and 0.75 microns from the surface.

5. The method of claim 1 further including forming an NMOS transistor adjacent to the vertical PNP transistor.

6. The method of claim 1 wherein covering the substrate and the N-type region with the thin P-type epitaxial layer includes covering the substrate and the N-type region with the thin P-type epitaxial layer having a thickness of between approximately 1.0 and 1.6 microns.

7. A method of forming a PNP transistor comprising:

providing a substrate having a thin P-type epitaxial layer and a P-type well that is a portion of the thin P-type epitaxial layer having an underlying N-type buried layer and a surrounding N-type sinker that extends from the N-type buried layer to a surface of the thin epitaxial layer;

applying a base mask on the surface wherein the base mask has a base opening that exposes a portion of the P-type well;

doping a portion of the well with a P-type dopant, the doping being performed through the opening for the purpose of forming a low resistance P-type collector enhancement having a first distance from the surface;

forming an N-type base region overlying the P-type collector enhancement wherein the N-type base region is formed through the base opening;

forming an emitter within the base region;

forming a base contact within the base region; and forming a collector contact region within the P-type well and external to the base region.

8. The method of claim 7 wherein doping the portion of the well with the P-type dopant includes implanting a P-type dopant through the base opening.

9. The method of claim 8 wherein implanting the P-type dopant through the base opening includes implanting a boron dopant for forming a boron doping concentration that is between approximately $1 \times 10^{17}$ atoms/cm$^3$ and $1 \times 10^{18}$ atoms/cm$^3$.

10. The method of claim 7 wherein the doping the portion of the well with the P-type dopant step includes forming the first distance to be between approximately 0.5 and 0.75 microns from the surface.

11. The method of claim 7 wherein providing the semiconductor substrate having the thin P-type epitaxial layer includes providing the semiconductor substrate having the P-type epitaxial layer with a thickness of between approximately 1.0 and 1.6 microns.

12. A method of forming a bipolar transistor comprising:
   providing a semiconductor substrate having a first conductivity type;
   forming a first isolation region of a second conductivity type on a portion of the substrate;
   covering the first isolation region with a thin epitaxial layer of the first conductivity type;
   forming a well of the first conductivity type on a surface of the thin epitaxial layer wherein the well overlays the first isolation region and is surrounded by a second isolation region of the second conductivity type that intersects the first isolation region;
   covering a portion of the thin epitaxial layer with a mask having a base opening that exposes a portion of the well;
   doping a portion of the well through the base opening for forming a low resistance collector enhancement of the first conductivity type that is a first distance from the surface; and
   forming a base region of the second conductivity type by doping the well through the base opening so that the base region is overlying the collector enhancement and is a second distance from the surface which is less than the first distance.

13. The method of claim 12 wherein providing the semiconductor substrate having the thin epitaxial layer includes providing the semiconductor substrate having the thin epitaxial layer with a thickness of at least 1.0 microns but less than 2.0 microns.

14. The method of claim 12 wherein the forming the base region step includes forming a collector-base junction between the base region and the collector enhancement, the collector-base junction having a distance between approximately 0.25 and 0.5 microns from the surface.

15. The method of claim 12 wherein providing the semiconductor substrate having the thin epitaxial layer of the first conductivity type includes having a P-type thin epitaxial layer.

* * * * *